US012733233B2

(12) United States Patent
Jang et al.

(10) Patent No.: US 12,733,233 B2
(45) Date of Patent: Sep. 8, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Shu-Uei Jang, Hsinchu (TW); Chung-Shu Wu, Taoyuan (TW); Ya-Wei Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 372 days.

(21) Appl. No.: 18/451,805

(22) Filed: Aug. 17, 2023

(65) Prior Publication Data

US 2025/0063790 A1 Feb. 20, 2025

(51) Int. Cl.

*H10D 64/01* (2025.01)
*H10D 30/01* (2025.01)
*H10D 30/43* (2025.01)
*H10D 30/67* (2025.01)
*H10D 62/10* (2025.01)

(52) U.S. Cl.

CPC ......... *H10D 64/017* (2025.01); *H10D 30/014* (2025.01); *H10D 30/43* (2025.01); *H10D 30/6734* (2025.01); *H10D 30/6735* (2025.01); *H10D 30/6757* (2025.01); *H10D 62/121* (2025.01); *H10D 64/018* (2025.01)

(58) Field of Classification Search

CPC .... H10D 64/017; H10D 30/014; H10D 30/43; H10D 30/6734; H10D 30/6735

See application file for complete search history.

(56) References Cited

U.S. PATENT DOCUMENTS 10,832,907 B2 * 11/2020 Cheng .................. H10D 64/017
10,930,794 B2 * 2/2021 Ching ................ H10D 30/6757
11,107,904 B2 * 8/2021 Lin ...................... H10D 30/014
11,444,199 B2 * 9/2022 More .................. H10D 62/822

(Continued)

FOREIGN PATENT DOCUMENTS

CN 107749421 B * 11/2020 ........... H10D 30/014
CN 114823536 A * 7/2022 ......... H10D 84/0158

(Continued)

*Primary Examiner* — Laura M Menz

(74) *Attorney, Agent, or Firm* — Ingrassia Fisher & Lorenz, LLP | IF&L

(57) ABSTRACT

A semiconductor fabrication method includes: forming, on a substrate, an epitaxial stack comprising at least one sacrificial epitaxial layer and at least one channel epitaxial layer; forming a fin in the epitaxial stack; forming a sacrificial gate stack on channel regions of the fin; forming gate sidewall spacers on sidewalls of the sacrificial gate stack; performing pre-treatment operations to remove impurities from the at least one sacrificial epitaxial layer; recessing the at least one sacrificial epitaxial layer to form a cavity; forming inner spacer material in the cavity; forming source/drain features; removing the sacrificial gate stack and the at least one sacrificial epitaxial layer in the fins; and forming a metal gate to replace the sacrificial gate stack and the at least one sacrificial epitaxial layer, wherein the inner spacers have sufficient thickness to resist epi damage.

20 Claims, 13 Drawing Sheets

(56) References Cited

U.S. PATENT DOCUMENTS

| | | | | |
|---|---|---|---|---|
| 11,569,348 | B2 * | 1/2023 | Kuang | H10D 62/121 |
| 12,142,683 | B2 * | 11/2024 | More | H10D 30/014 |
| 12,255,249 | B2 * | 3/2025 | Khaderbad | H10D 64/017 |
| 12,389,635 | B2 * | 8/2025 | Tu | H10D 30/6757 |
| 12,598,762 | B2 * | 4/2026 | Lee | H10D 30/0243 |
| 2018/0301531 | A1 * | 10/2018 | Xie | H10D 62/121 |
| 2019/0081155 | A1 * | 3/2019 | Xie | H10D 64/018 |
| 2020/0006577 | A1 * | 1/2020 | Ching | H10D 30/6757 |
| 2020/0266060 | A1 * | 8/2020 | Cheng | H10D 64/017 |
| 2021/0217876 | A1 * | 7/2021 | Reznicek | H10D 30/6211 |
| 2021/0328017 | A1 * | 10/2021 | Reznicek | H10D 62/292 |
| 2022/0037520 | A1 * | 2/2022 | More | H10D 62/121 |
| 2022/0367706 | A1 * | 11/2022 | More | H10D 62/822 |
| 2023/0024357 | A1 * | 1/2023 | Huang | H10D 84/038 |
| 2023/0029393 | A1 * | 1/2023 | Chen | H10D 1/47 |
| 2023/0114789 | A1 * | 4/2023 | More | H10D 30/6713<br>257/347 |
| 2024/0063284 | A1 * | 2/2024 | Tu | H10D 62/822 |
| 2024/0063293 | A1 * | 2/2024 | Lin | H10D 64/017 |
| 2024/0072114 | A1 * | 2/2024 | Lo | H10D 30/6757 |
| 2024/0290850 | A1 * | 8/2024 | Fan | H10D 30/6729 |
| 2024/0355899 | A1 * | 10/2024 | Lee | H10D 84/0181 |
| 2024/0387735 | A1 * | 11/2024 | More | H10D 62/405 |
| 2025/0040214 | A1 * | 1/2025 | Kao | H10D 62/121 |
| 2025/0063790 | A1 * | 2/2025 | Jang | H10D 64/018 |
| 2025/0081549 | A1 * | 3/2025 | Chen | H10D 62/121 |
| 2025/0169090 | A1 * | 5/2025 | Jang | H10D 30/024 |
| 2025/0203992 | A1 * | 6/2025 | Khaderbad | H10D 64/017 |
| 2025/0234592 | A1 * | 7/2025 | Lan | H10D 30/6735 |
| 2025/0301744 | A1 * | 9/2025 | Chang | H10D 64/018 |
| 2025/0359230 | A1 * | 11/2025 | Tang | H10D 64/017 |

FOREIGN PATENT DOCUMENTS

| | | | | | |
|---|---|---|---|---|---|
| CN | 115841948 | A | * | 3/2023 | H10P 14/3452 |
| CN | 118231255 | A | * | 6/2024 | H10D 30/6215 |
| CN | 119008529 | A | * | 11/2024 | H10D 64/017 |
| CN | 119133215 | A | * | 12/2024 | H10D 30/43 |
| DE | 102018214400 | B4 | * | 3/2022 | H10P 50/695 |
| TW | 202002026 | A | | 1/2020 | |
| TW | 1868706 | B | * | 1/2025 | H10D 84/0147 |
| TW | 202505637 | A | * | 2/2025 | H10D 84/0184 |
| TW | 202510344 | A | * | 3/2025 | H10D 64/018 |
| TW | 1887886 | B | * | 6/2025 | H10D 64/018 |
| TW | 1889145 | B | * | 7/2025 | H10D 84/0184 |

* cited by examiner 316a
316b
316c
317a
317b
317c
318a
318b
318c
310
319
312
314

214
236

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
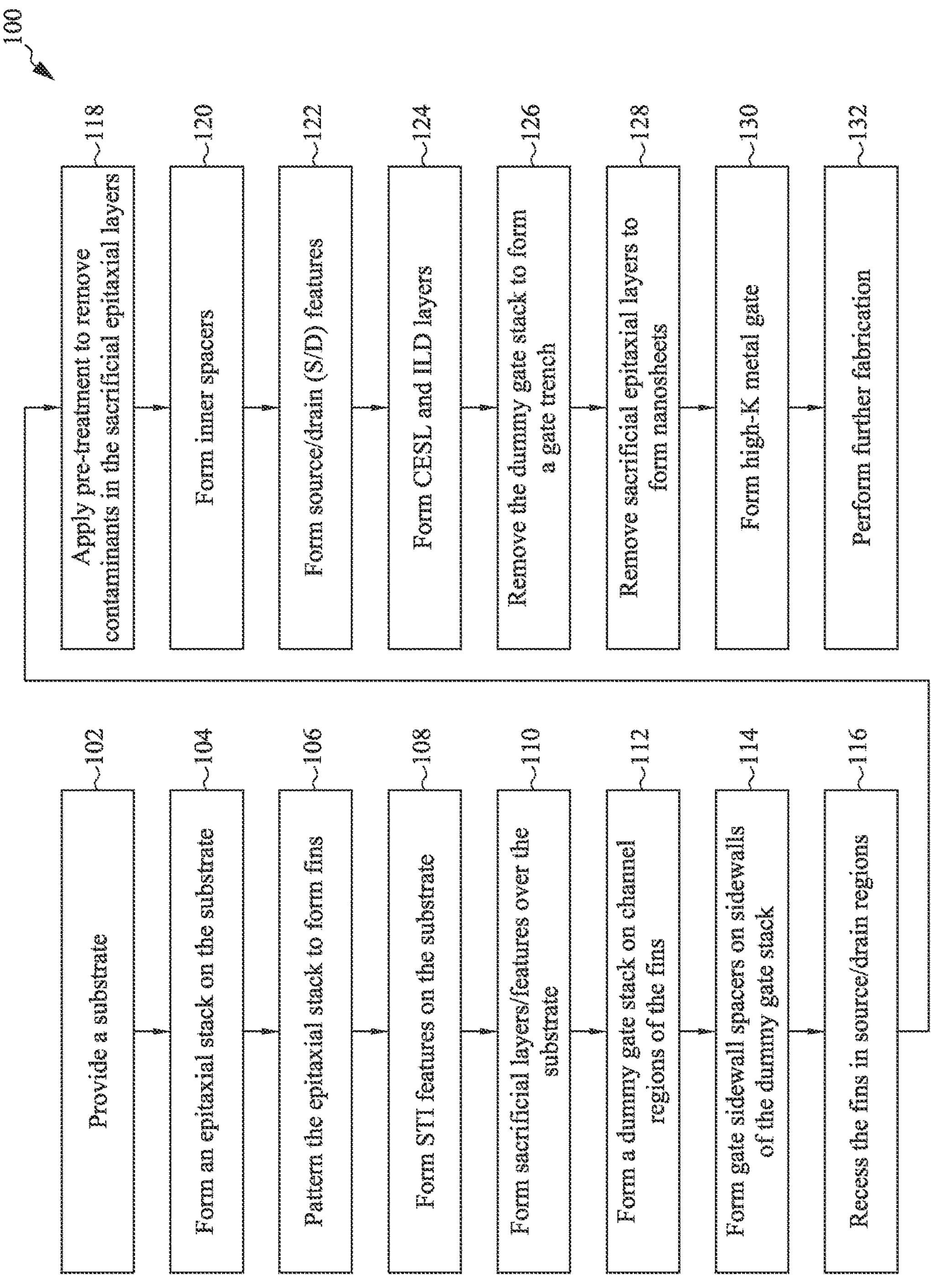
FIG. 1 is a flow chart depicting an example method of semiconductor fabrication including fabrication of multi-gate devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer, or section. Thus, a first element, component, region, layer, portion, or section discussed below could be termed a second element, component, region, layer, portion, or section without departing from the teachings of the present disclosure.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

In certain embodiments herein, a "material layer" is a layer that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a layer that is a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of an aluminum layer and a layer of aluminum is a layer that is at least 50 wt. %, at least 60 wt. %, at least 75 wt. %, at least 90 wt. %, at least 95 wt. %, or at least 99 wt. % of aluminum.

It is to be understood that the phraseology or terminology herein is for the purpose of description and not of limitation, such that the terminology or phraseology of the present specification is to be interpreted by those skilled in relevant art(s) in light of the teachings herein.

The following disclosure provides many different embodiments, or examples, for implementing different features of the disclosed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As used herein, a "layer" is a region, such as an area comprising arbitrary boundaries, and does not necessarily comprise a uniform thickness. For example, a layer can be a region comprising at least some variation in thickness.

The present disclosure is generally related to semiconductor devices and the fabrication thereof, and more particularly to multi-gate devices. Multi-gate devices include those transistors whose gate structures are formed on at least two-sides of a channel region. These multi-gate devices may include an n-type metal-oxide-semiconductor device or a p-type metal-oxide-semiconductor multi-gate device. Specific examples herein may be presented and referred to herein as a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or another suitable channel configuration. Presented herein are embodiments of devices that may have one or more channel regions (e.g., nanosheets) associated with a single, contiguous gate structure. However, one of ordinary skill would recognize that the teaching can apply to a single channel or any number of channels, such as a FinFET device, on account of its fin-like structure. One of ordinary skill may recognize other examples of semiconductor devices that may benefit from aspects of the present disclosure.

The gate-all-around (GAA) silicon nanosheet structures have been recognized as excellent candidates to achieve improved power performance and area scaling compared to other FinFET technologies. Specifically, GAA structures provide high drive currents due to wide effective channel width while maintaining short-channel control. Various embodiments disclosed can provide a method of controlling SiGe CD, and also a method of controlling MG CD for improved device performance.

FIG. 1 is a flow chart depicting an example method 100 of semiconductor fabrication including fabrication of multi-gate devices. according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nano structure" or "nanosheet," which is used herein to designate any material portion with nanoscale, or even microscale dimensions, and having an elongate shape, regardless of the cross-sectional shape of this portion. Thus, the term "nanostructure" or "nanosheet" as used herein designates both circular and substantially circular cross-section elongate material portions, and beam or bar-shaped material portions including for example a cylindrical in shape or substantially rectangular cross-section.

FIG. 1 is described in conjunction with FIGS. 2-11 and 13-22, which illustrate a semiconductor device 200 or structure at various stages of fabrication in accordance with some embodiments. The method 100 is merely an example and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device 200 depicted in the figures, and some of the features described below can be replaced, modified, or eliminated in other embodiments.

As with the other method embodiments and exemplary devices discussed herein, it is understood that parts of the semiconductor devices may be fabricated by semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and/or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 100, include any descriptions given with reference to the figures, as with the remainder of the method and exemplary figures provided in this disclosure, are merely exemplary and are not intended to be limiting beyond what is specifically recited in the claims that follow.

Figure 7:
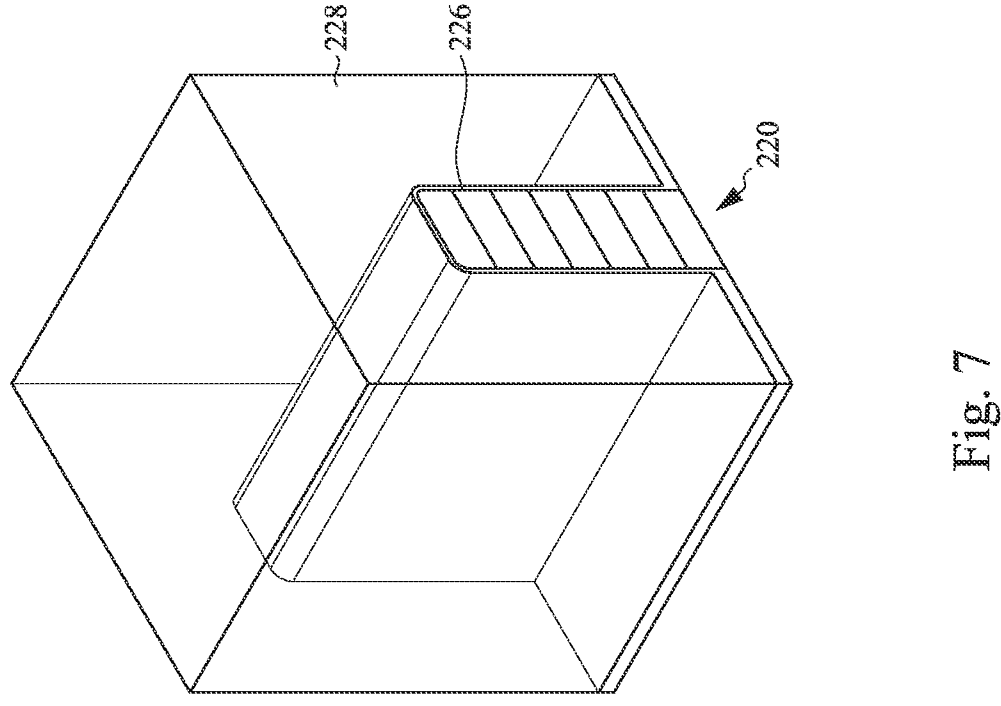
Figure 6:
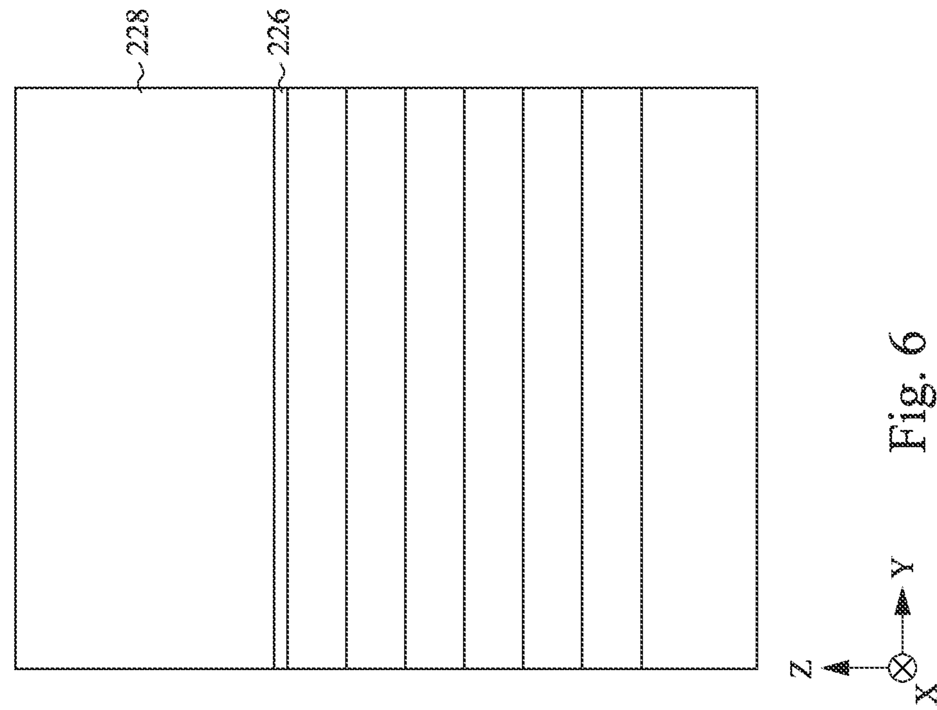
Figure 9:
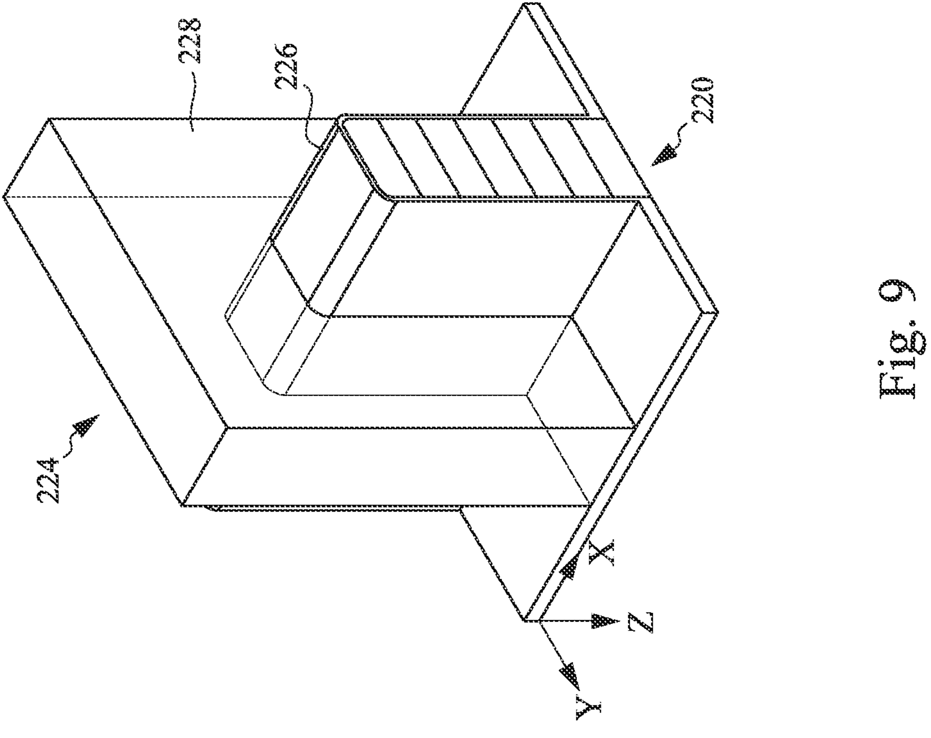
Figure 8:
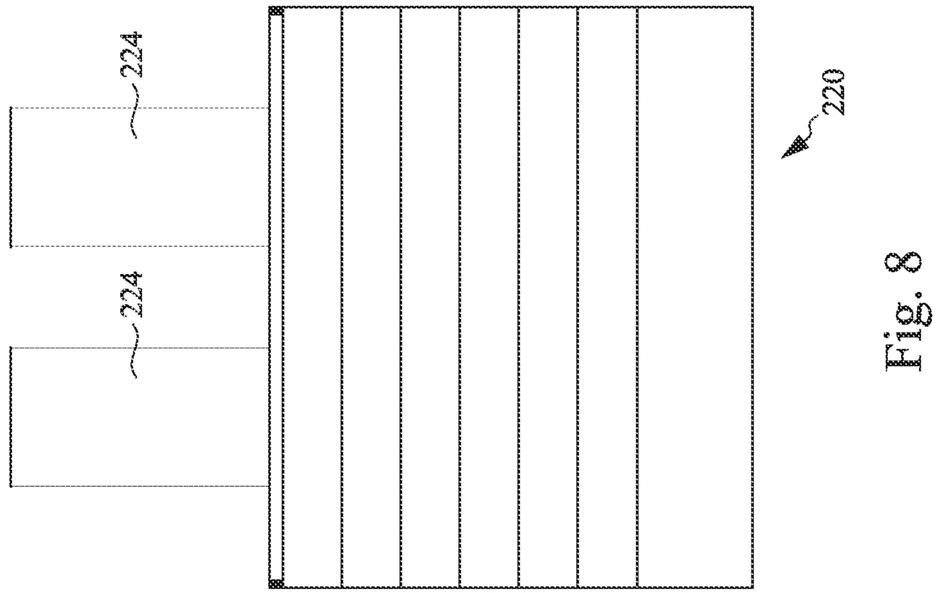
Figure 11:
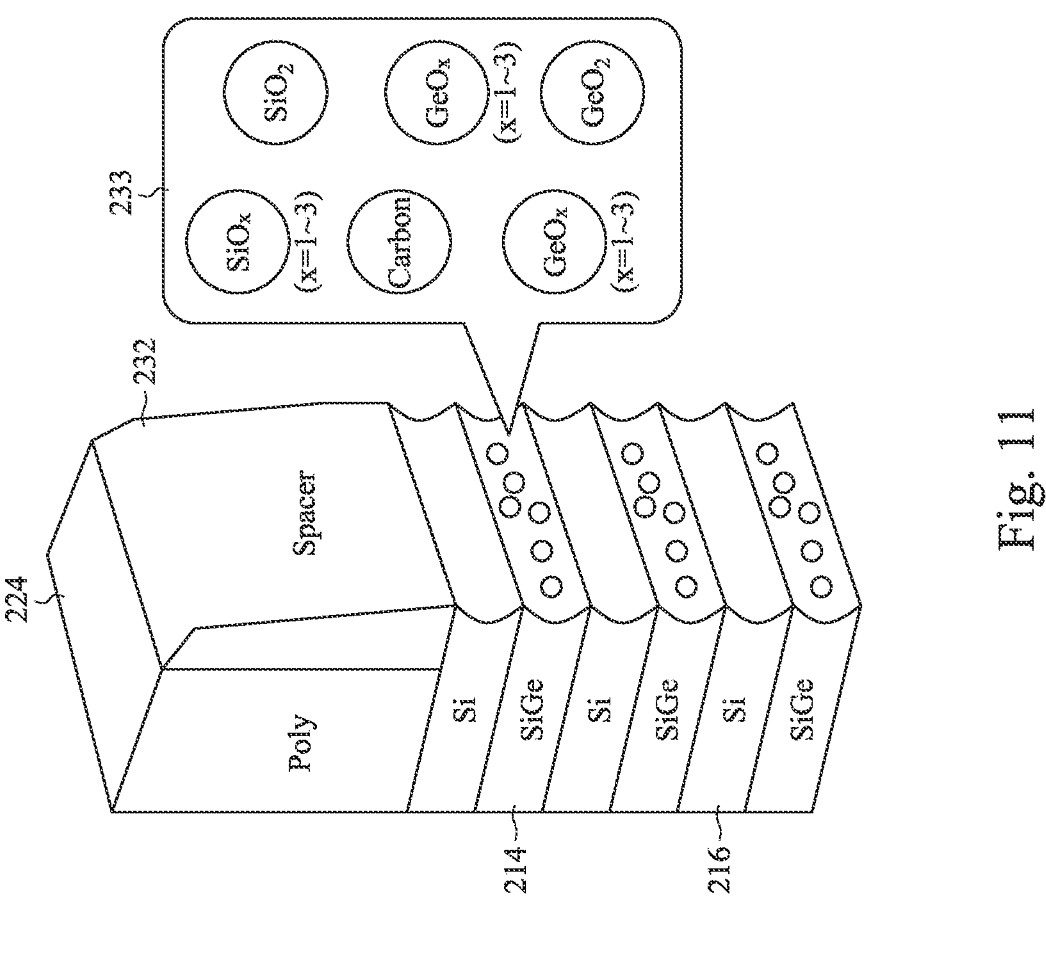
Figure 10:
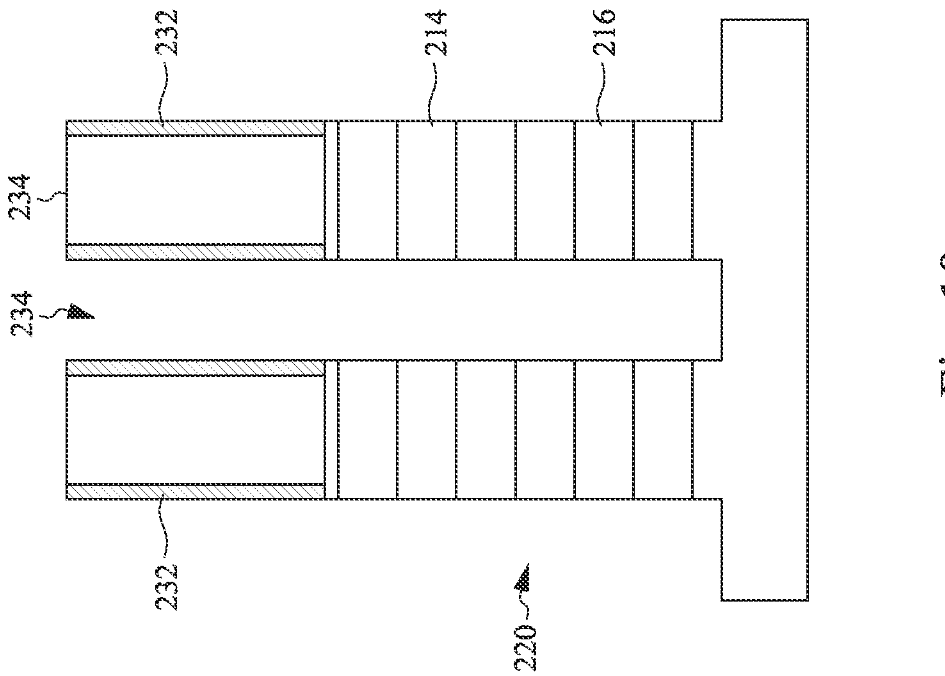

FIGS. 2-6, 8, 10, and 13-22 cross-sectional side views of an embodiment of the example semiconductor device 200 at various stages of fabrication in an example fabrication process in accordance with some embodiments. FIGS. 7, 9 and 11 are three-dimensional schematic views of a portion of the example semiconductor device 200 at various stages of fabrication in an example fabrication process in accordance with some embodiments. In some figures, some reference numbers of components or features illustrated therein may be omitted to avoid obscuring other components or features; this is for ease of depicting the figures.

At block 102, the example method 100 includes providing a substrate. Referring to the example of FIG. 2, in an embodiment of block 102, a substrate 202 is provided for forming a multi-gate device 200. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 has isolation features (e.g., shallow trench isolation (STI) features) interposing the regions providing different device types. Further, the substrate 202 may be strained for performance enhancement, may include a silicon-on-insulator (SOI) structure, and/or have other suitable enhancement features.

Figures 2, 3:
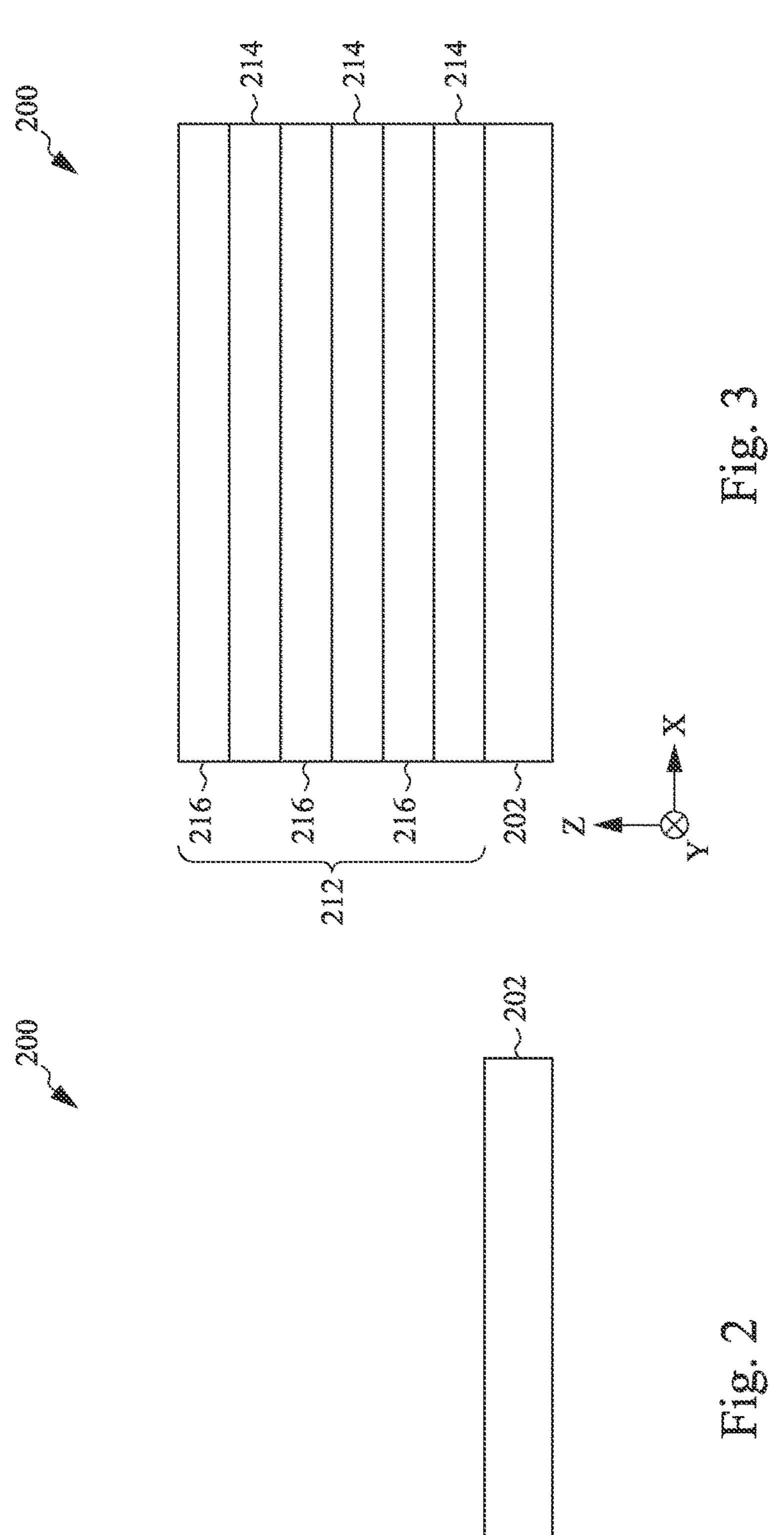
FIGS. 2-11 and 13-22 are schematic diagrams that illustrate a semiconductor device or structure at various stages of fabrication, in accordance with some embodiments.
Figure 5:
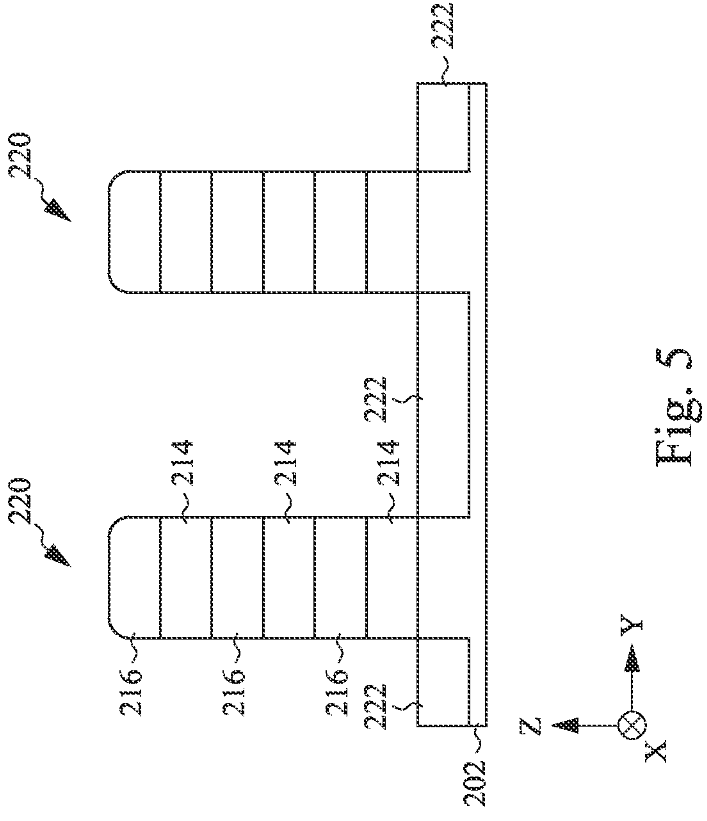
Figure 4:
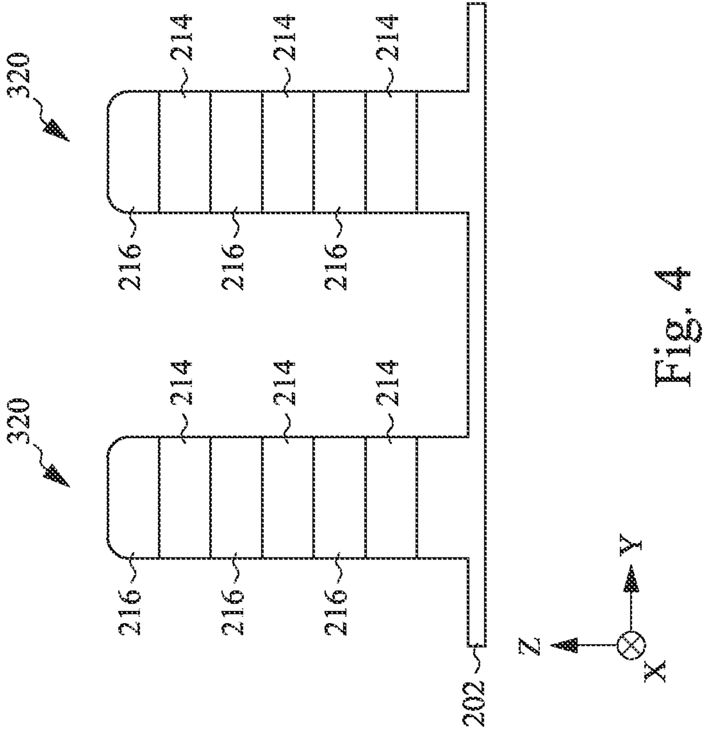

At block 104, the example method 100 then includes forming one or more epitaxial layers over the substrate. Referring to the example of FIG. 3, in an embodiment of block 104, an epitaxial stack 212 is formed over the substrate 202. The epitaxial stack 212 includes sacrificial epitaxial layers 214 of a first composition interposed by channel epitaxial layers 216 of a second composition. The first and second composition can be different. In an embodiment, the sacrificial epitaxial layers 214 are formed from SiGe and the channel epitaxial layers 216 are formed from silicon (Si). However, other embodiments are possible including those that provide for a first composition and a second composition having different oxidation rates and/or etch selectivity. In some embodiments, the sacrificial epitaxial layer 214 includes SiGe and the channel epitaxial layer 216 includes silicon (Si). However, other embodiments are possible including those that provide for a first composition and a second composition having different oxidation rates and/or etch selectivity. In some embodiments, the sacrificial epitaxial layer 214 includes SiGe and where the channel epitaxial layer 216 includes Si, the Si oxidation rate of the channel epitaxial layer 216 is less than the SiGe oxidation rate of the sacrificial epitaxial layer 214. It is noted that three (3) layers each of epitaxial layers 214 and 216 are illustrated in FIG. 3, which is for illustrative purposes only and not intended to be limiting beyond what is specifically recited in the claims. In various embodiments, any number of epitaxial layers can be formed in the epitaxial stack 212; the number of layers depending on the desired number of channel regions for the device 200. In some embodiments, the number of channel epitaxial layers 216 is between 2 and 10, such as 3, 4 or 5.

In some embodiments, the sacrificial epitaxial layer 214 has a thickness ranging from about 4 nm to about 12 nm. The sacrificial epitaxial layers 214 may be substantially uniform in thickness. In some embodiments, the channel epitaxial layer 216 has a thickness ranging from about 3 nm to about 6 nm. In some embodiments, the channel epitaxial layers 216 of the stack are substantially uniform in thickness.

As described in more detail below, the channel epitaxial layer 216 may serve as channel region(s) for a subsequently-formed multi-gate device and its thickness is chosen based on device performance considerations. The sacrificial epitaxial layer 214 may serve to reserve a spacing (or referred to as a gap) between adjacent channel region(s) for a subsequently-formed multi-gate device and its thickness is chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the channel epitaxial layer 216, include the same material as the substrate 202, such as silicon (Si). In some embodiments, the epitaxially grown layers 214 and 216 include a different material than the substrate 202. As stated above, in at least some examples, the sacrificial epitaxial layer 214 includes an epitaxially grown $Si_{1-x}Ge_x$ layer (e.g., x is about 25~55%) and the channel epitaxial layer 216 includes an epitaxially grown Si layer. Alternatively, in some embodiments, either of the sacrificial epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the sacrificial epitaxial layers 214 and 216 may be chosen based on providing differing oxidation and etch selectivity properties. In various embodiments, the epitaxial layers 214 and 216 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

At block 106, the example method 100 includes patterning the epitaxial stack to form semiconductor fins (also referred to as fins). Referring to the example of FIG. 4, in an embodiment of block 106, a plurality of fins 220 extending from the substrate 202 are formed. In various embodiments, each of the fins 220 includes an upper portion of the interleaved epitaxial layers 214 and 216 and a bottom portion protruding from the substrate 202.

The fins 220 may be fabricated using suitable processes including photolithography and etch processes. The photolithography process may include forming a photoresist layer over the substrate 202 (e.g., over the epitaxial stack 212), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and epitaxial stack 212 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

At block 108, the example method 100 includes forming STI features on the substrate. In various embodiments, the STI features are formed by filling trenches between adjacent fins with a dielectric material to form an isolation feature. Referring to the example of FIG. 5, in an embodiment of block 108, a plurality of fins 220 with interleaved epitaxial layers 214 and 216 extend from the substrate 202. Isolation features 222, such as STI features 222 have been formed in trenches between adjacent fins 220. The sidewalls of the sacrificial epitaxial layers 214 have expanded during STI formation due to a heating effect during STI formation. In this example, because the sacrificial epitaxial layers 214 had been etched prior to the heating process during STI formation, the width of the sacrificial epitaxial layers 214 have expanded to be equal to the width of the channel epitaxial layers 216.

The isolation feature 222 may include one or more dielectric layers. Suitable dielectric materials for the isolation feature 222 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. The deposited isolation features 222 are subsequently recessed to form shallow trench isolation (STI) features (also denoted as STI features 222). In the illustrated embodiment, the STI features 222 are disposed on sidewalls of the protruding portion of the substrate 202. A top surface of the STI feature 222 may be coplanar with a bottom surface of the epitaxial stack 212 or lower than the bottom surface of the epitaxial stack 212 for about 1 nm to about 10 nm. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220.

At block 110, the example method 100 includes forming sacrificial layers/features over the substrate. Referring to the example of FIGS. 6 and 7, in an embodiment of forming sacrificial layers/features over the substrate, a sacrificial gate dielectric layer 226 is blanket deposited the over the fins 220. A sacrificial gate electrode layer 228 is then blanket deposited on the sacrificial gate dielectric layer 226 and over the fins 220. The sacrificial gate electrode layer 228 includes silicon such as polycrystalline silicon or amorphous silicon. The thickness of the sacrificial gate dielectric layer is in a range from about 1 nm to about 5 nm in some embodiments. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer 226 and the sacrificial gate electrode layer 228 are deposited using CVD, including LPCVD and PECVD, PVD, ALD, or other suitable processes.

At block 112, the example method 100 includes patterning the sacrificial layers/features to form a dummy gate structure on channel regions of the fins. Referring to the example of FIGS. 8 and 9, in an embodiment of block 112, a sacrificial gate structure 224 is formed over portions of the fins 220 which is to be channel regions. The sacrificial gate structure 224 defines the channel regions of the GAA devices. The sacrificial gate structure 224 includes a sacrificial gate dielectric layer 226 and a sacrificial gate electrode layer 228. The sacrificial gate structure 224 is formed by forming a mask layer over the sacrificial gate electrode layer. The mask layer may include a pad silicon oxide layer and a silicon nitride mask layer. Subsequently, a patterning operation is performed on the mask layer and sacrificial gate dielectric and electrode layers are patterned into the sacrificial gate structure 224. By patterning the sacrificial gate structure 224, the fins 220 are partially exposed on opposite sides of the sacrificial gate structure 224, thereby defining source/drain (S/D) regions. In this disclosure, a source and a drain are interchangeably used, and the structures thereof are substantially the same.

The sacrificial gate structure 224 is subsequently removed as discussed with reference to block 126 of the method 100 and will be replaced by a final gate stack at a subsequent processing stage of the device 200. In particular, the sacrificial gate structure 224 is replaced at a later processing stage by a high-K dielectric layer (HK) and metal gate electrode (MG) as discussed below.

At block 114, the example method 100 includes forming gate sidewall spacers on sidewalls of the dummy gate stack. Referring to the example of FIG. 10, in an embodiment of block 114, gate sidewall spacers 232 are formed on sidewalls of the sacrificial gate structure 224. The gate sidewall spacers 232 may include a dielectric material such as silicon oxide, silicon nitride, silicon carbide, silicon oxynitride, SiCN films, silicon oxycarbide, SiOCN films, and/or combinations thereof. In some embodiments, the gate sidewall spacers 232 include multiple layers, such as main spacer walls, liner layers, and the like. By way of example, the gate sidewall spacers 232 may be formed by depositing a dielectric material layer over the sacrificial gate structure 224 using processes such as, a CVD process, a subatmospheric CVD (SACVD) process, a flowable CVD process, an ALD process, a PVD process, or other suitable process. In some embodiments, the deposition of the dielectric material layer is followed by an etching-back (e.g., anisotropically) process to expose portions of the fin 220 adjacent to and not covered by the sacrificial gate structure 224 (e.g., S/D regions). The dielectric material layer may remain on the sidewalls of the sacrificial gate structure 224 as gate sidewall spacers 232. In some embodiments, the etching-back process may include a wet etch process, a dry etch process, a multiple-step etch process, and/or a combination thereof. The gate sidewall spacers 232 may have a thickness ranging from about 5 nm to about 20 nm.

At block 116, the example method includes recessing the fins in the source drain/regions. Referring to the example of FIG. 10, in an embodiment of block 116, the stacked epitaxial layers 214 and 216 are etched down at the S/D regions to form a recess 234. A top portion of the substrate 202 is also etched. In various embodiments, the recessing is performed by a suitable etching process, such as a dry etching process, a wet etching process, or an RIE process. Dry etching may be implemented using an etchant including a bromine-containing gas (e.g., HBr and/or CHBR3), a fluorine-containing gas (e.g., CF4, SF6, CH2F2, CHF3, and/or C2F6), other suitable gases, or combinations thereof.

At block 118, the example method 100 Includes applying pre-treatment operations to the sacrificial epitaxial layers 214 to remove impurities in the sacrificial epitaxial layers 214. Referring to the example of FIG. 11, in an embodiment prior to block 116, the sacrificial epitaxial layers 214 comprise SiGe and the impurities 233 may comprise $SiO_x$ (e.g., x=~1 to ~3), $SiO_2$, carbon (C), $GeO_x$ (e.g., x=~1 to ~3), $GeO_2$, and/or other impurities. The impurities may interfere with the subsequent formation of inner spacers around the sacrificial epitaxial layers 214. In various embodiments, the pre-treatment operations may include applying Hydrogen radicals (H*) and Nitrogen radicals (N*) to the sacrificial epitaxial layers 214 and channel epitaxial layers 216 (e.g., $SiOC+H^*+N^*:SiON+SiOH+CH_4+HCN$), and applying a HF flush to remove byproducts from applying the H and N radicals (e.g., $SiON+SiOH+HF:SiF_4+H_2O+NH_3$).

The impurities may cause increased line width roughness (LWR) of subsequently recessed sacrificial epitaxial layers 214, which, in turn, may cause subsequently formed inner spacers around the sacrificial epitaxial layers 214 to have less thickness than desired at various points leading to epi damage and metal gate to metal drain shorts and reduced production yield. To reduce the likelihood of increased LWR, epi damage, and metal gate to metal drain shorts, a pre-treatment is applied to the sacrificial epitaxial layers 214 to remove impurities in the sacrificial epitaxial layers 214.

Figures 12A, 12B:
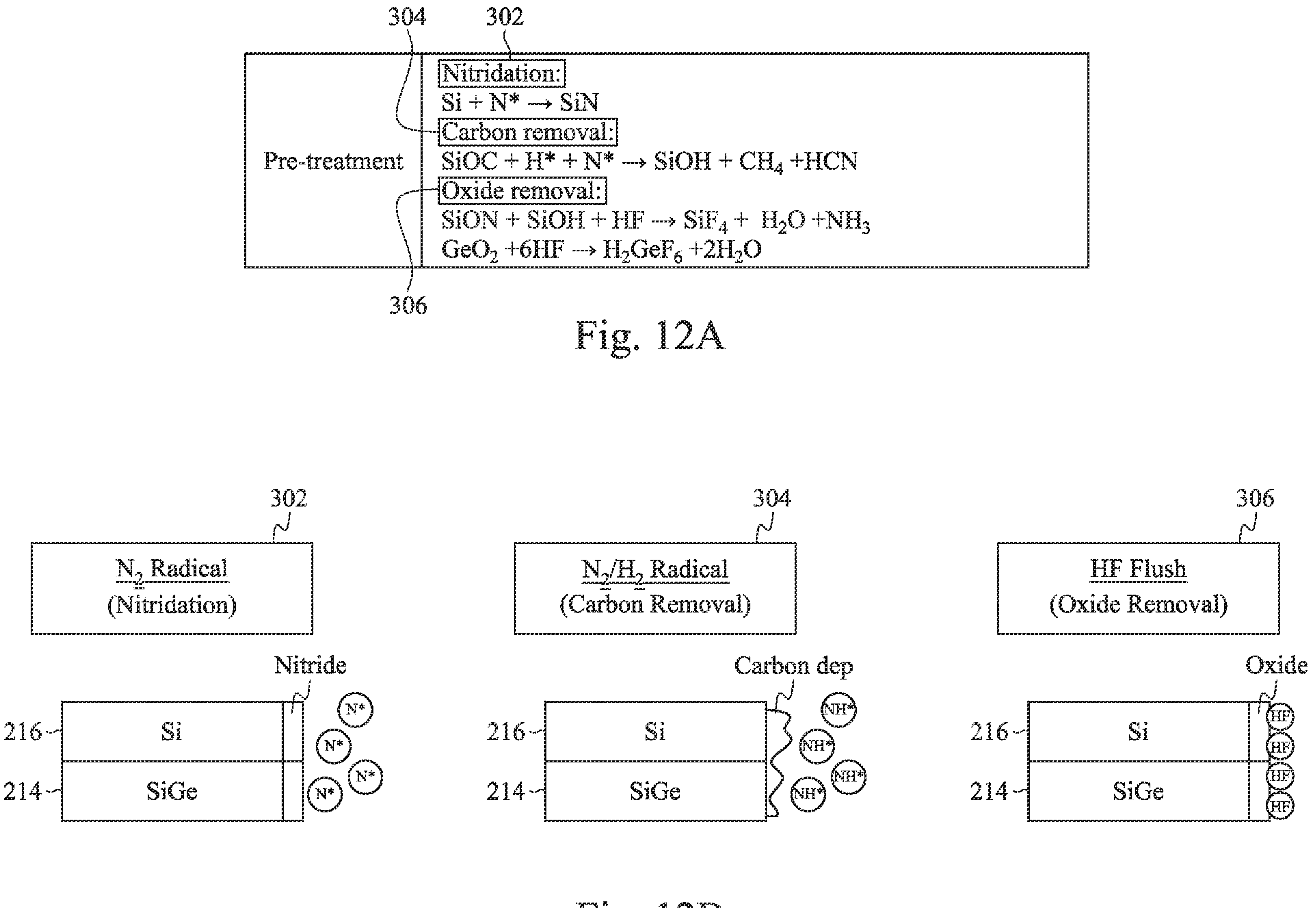
FIGS. 12A and 12B are block diagrams providing an example of pre-treatment operations, in accordance with some embodiments.

Referring to the example of FIGS. 12A and 12B, in an embodiment of block 116, pre-treatment operations 300 are applied to the sacrificial epitaxial layers 214 to remove impurities in the sacrificial epitaxial layers 214. The pre-treatment operations, in this example, include nitridation operations 302, carbon removal operations 304, and oxide removal operations 306. The nitridation operations 302 include applying $N_2$ radicals to the sacrificial epitaxial layers 214 and channel epitaxial layers 216. The carbon removal operations 304 include applying $N_2$ and $H_2$ radicals to the sacrificial epitaxial layers 214 and channel epitaxial layers 216 to remove carbon. The oxide removal operations 306 include applying a hydrogen fluoride (HF) flush to the sacrificial epitaxial layers 214 and channel epitaxial layers 216 to remove Oxide.

Figure 13:
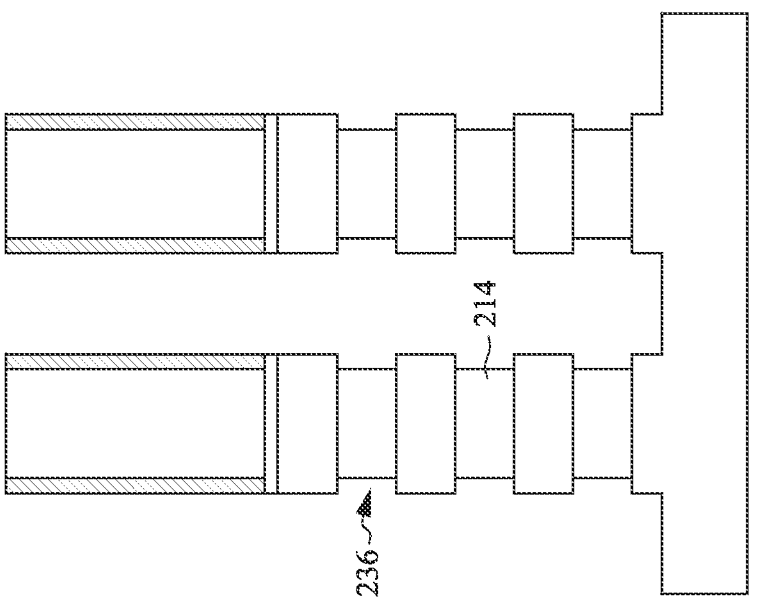

At block 120, the example method 100 Includes forming inner spacers. Forming inner spacers include recessing sacrificial epitaxial layers (e.g., SiGe), depositing inner spacer material, and etching back inner spacer material. FIG. 13 provides an example embodiment after recessing sacrificial epitaxial layers 214 forming a cavity 236. The sacrificial epitaxial layers 214 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. Alternatively, at block 120 lateral ends of the sacrificial epitaxial layers 214 that are exposed in the recess 234 may be selectively oxidized to increase the etch selectivity between the epitaxial layers 214 and 216. In some examples, the oxidation process may be performed by exposing the device 200 to a wet oxidation process, a dry oxidation process, or a combination thereof.

Because of the pre-treatment, the line-width roughness (LWR) of the sacrificial epitaxial layers 214 may be decreased. In various embodiments, the LWR may be 4.4 nm when pre-treatment operations are applied and 6.4 nm without the application of pre-treatment operations. The pre-treatment operations may result in an improvement of LWR of about 31.2% in various embodiments.

Figure 14:
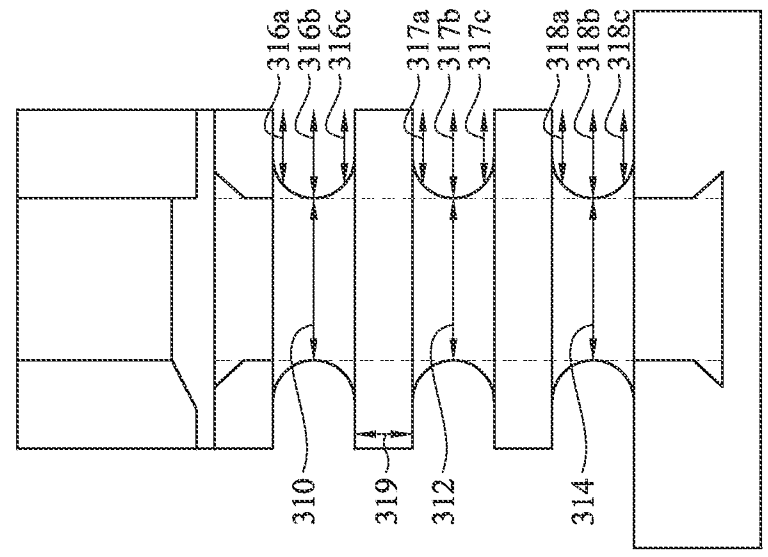

FIG. 14 provides another example embodiment after recessing sacrificial epitaxial layers 214 (e.g., SiGe). In this example, the SiGe critical dimension (CD) 310, which is equal to the metal gate (MG) CD at the end of line (EOL) is in the range of 5-20 nm; the SiGe CD 312 (e.g., MG CD at EOL) is in the range of 5-20 nm; and the SiGe CD 314 (e.g., MG CD at EOL) is in the range of 5-20 nm. In this example, the recessed dimensions 316*a*, 316*b*, 316*c*, 317*a*, 317*b*, 317*c*, 318*a*, 318*b*, and 318*c* are in the range of less than 6 nm. In this example, the channel epitaxial layers 216 have a thickness 319 in the range of 3-10 nm.

Figure 15:
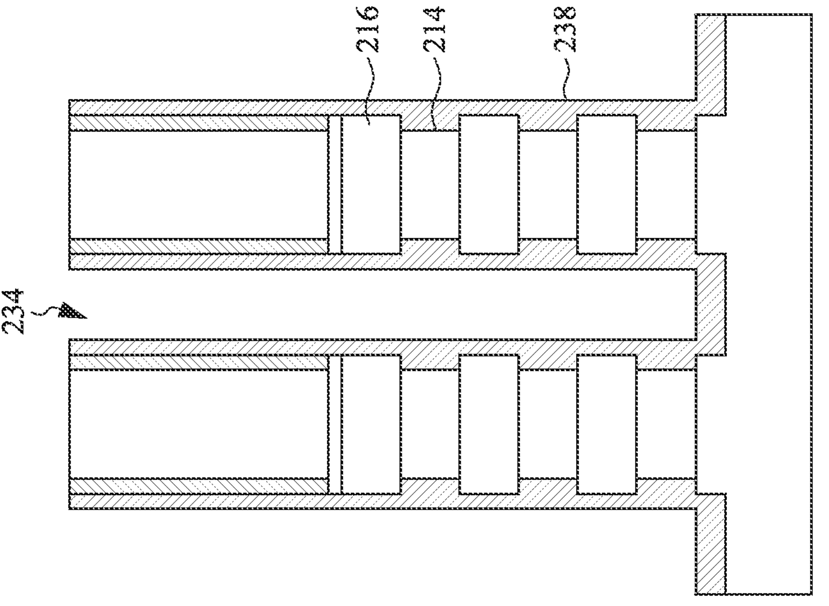

FIG. 15 provides an example embodiment after depositing inner spacer material. An inner spacer material layer 238 is formed on the lateral ends of the sacrificial epitaxial layers 214 in the cavity 236 and on the channel epitaxial layers 216 in the recess 234. The inner spacer material layer 238 may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238 can be formed by ALD or any other suitable method. By conformally forming the inner spacer material layer 238, the size of the cavity 236 is reduced or completely filled.

Figure 16:
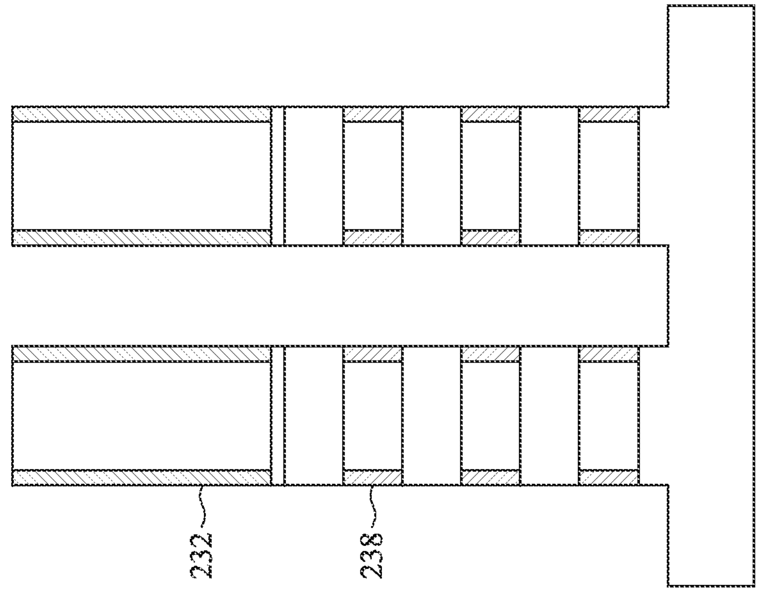

FIG. 16 provides an example embodiment after etching back the inner spacer material layer 238. After the inner spacer material layer 238 is formed, an etching operation is performed to partially remove the inner spacer material layer 238. By this etching, the inner spacer material layer 238 remains substantially within the cavity 236, because of a small volume of the cavity. Generally, plasma dray etching etches a layer in wide and flat areas faster than a layer in concave (e.g., holes, grooves and/or slits) portions. Thus, the inner spacer material layer 238 can remain inside the cavity 236. The remaining portions of the inner spacer material layer 238 is denoted as the inner spacers 238.

Figure 17:
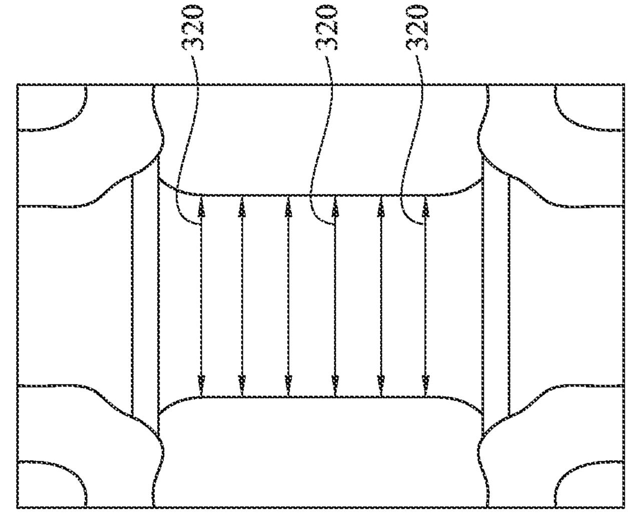
Figure 18:
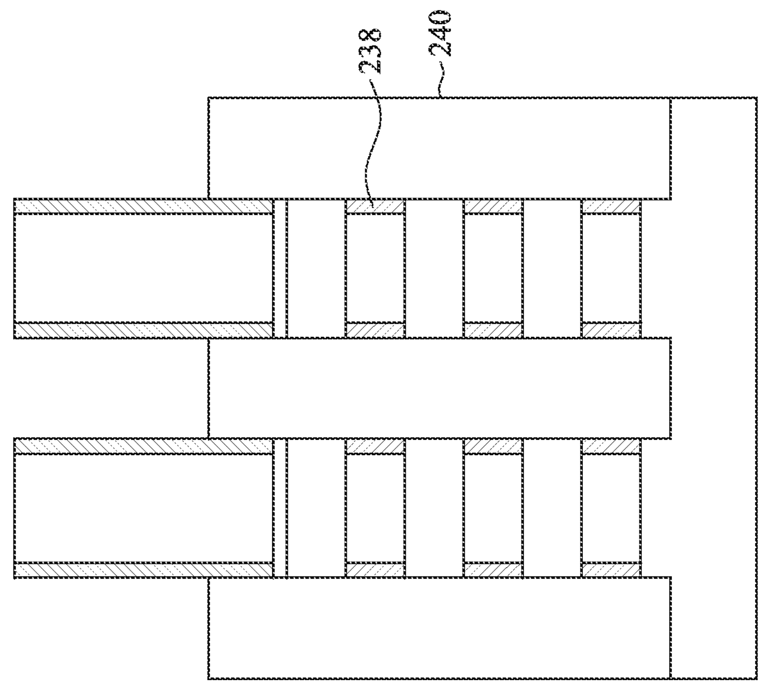
Figure 20:
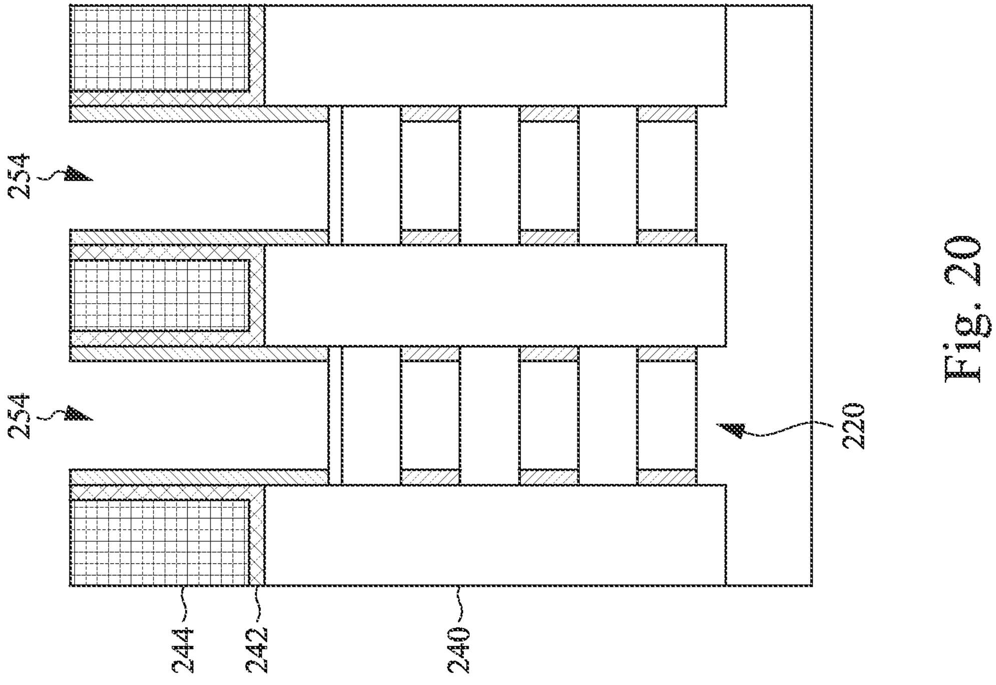
Figure 19:
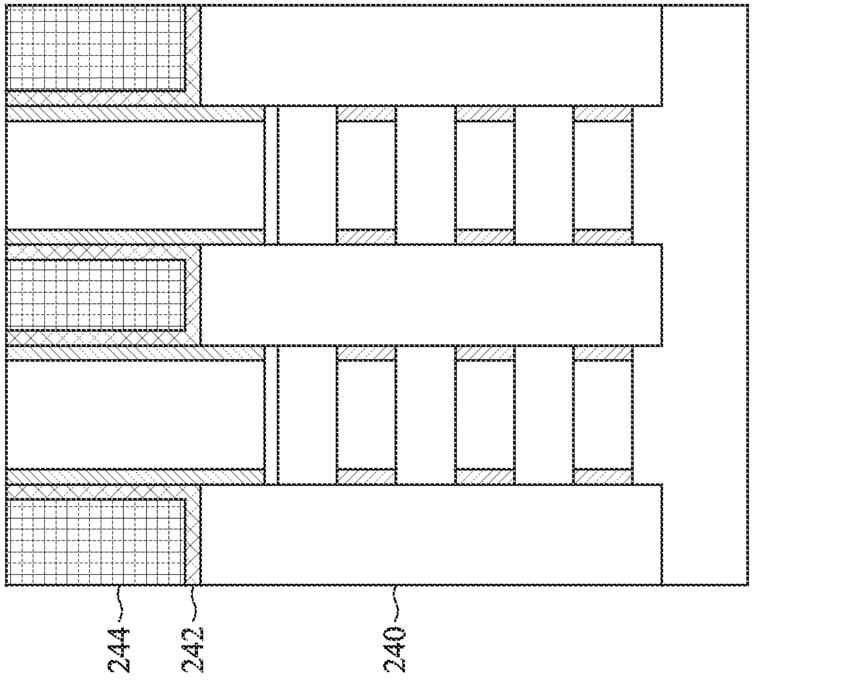
Figure 22:
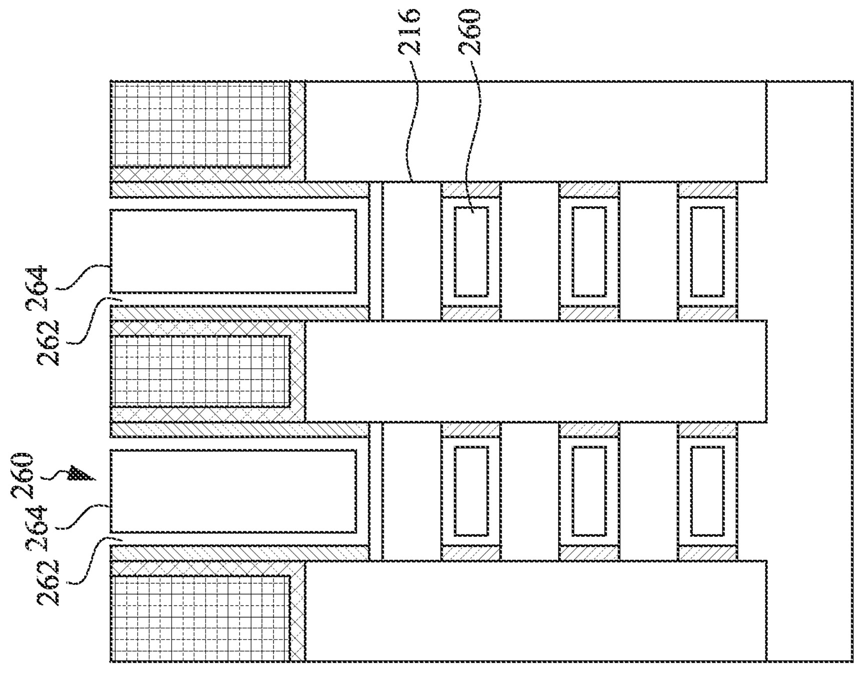
Figure 21:
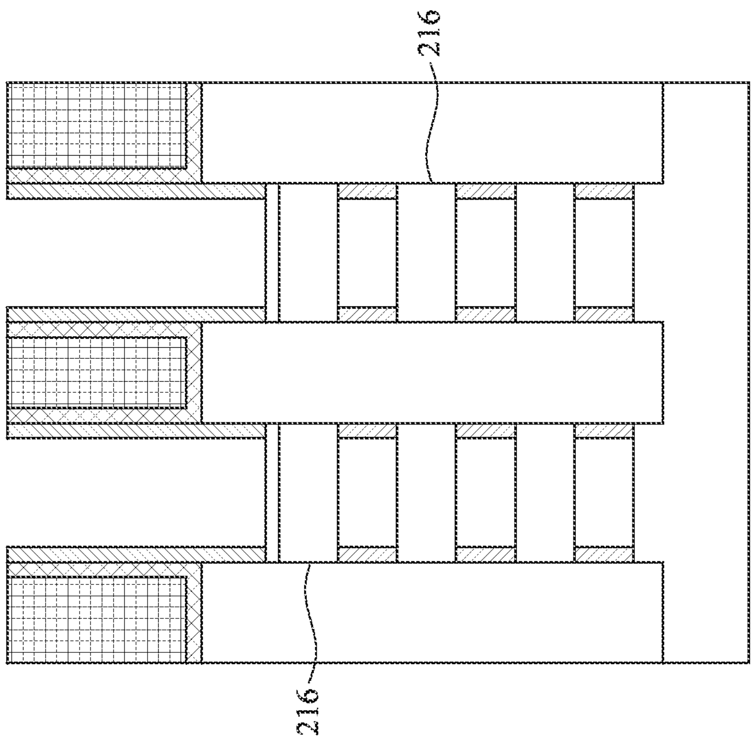

FIG. 17 provides another example embodiment after etching back the inner spacer material layer 238. In this example, the variation in SiGe CD 320 (i.e., CD range) is less than (<) 3 nm.

At block 122, the example method 100 includes forming source/drain (S/D) features. Referring to the example of FIG. 18, in an embodiment of block 122. Epitaxial S/D features 240 are formed in recess 234. In some embodiments, the epitaxial S/D features 240 include silicon for NFETs and SiGe for PFETs. In some embodiments, the epitaxial S/D features 240 are formed by an epitaxial growth method using CVD, ALD, or molecular beam epitaxy (MBE). The epitaxial S/D features 240 are formed in contact with the channel epitaxial layers 216, and separated from the sacrificial epitaxial layers 214 by the inner spacers 238.

At block 124, the example method 100 includes forming CESL and ILD layers. Referring to the example of FIG. 19, in an embodiment of block 124, a contact etch stop layer (CESL) 242 is formed over the epitaxial S/D features 240 and an interlayer dielectric (ILD) layer 244 is formed over the CESL layer 242. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD, flowable CVD (FCVD), or other suitable methods. In some embodiments, forming the ILD layer 244 further includes performing a CMP process to planarize a top surface of the device 200, such that the top surfaces of the sacrificial gate structure 224 are exposed.

At block 126, the example method 100 includes removing the dummy gate stack to form a gate trench. Referring to the example of FIG. 20, in an embodiment of block 126, the sacrificial gate structure 224 is removed to form a gate trench 254. The gate trench 254 exposes the fin 220 in the channel region(s). The ILD layer 244 and the CESL layer 242 protects the epitaxial S/D features 240 during the removal of the sacrificial gate structure 224. The sacrificial gate structure 224 can be removed using plasma dry etching and/or wet etching. When the sacrificial gate electrode layer is polysilicon and the ILD layer 244 is an oxide, a wet etchant such as a TMAH solution can be used to selectively remove the sacrificial gate electrode layer. The sacrificial gate dielectric layer is thereafter removed using plasma dry etching and/or wet etching.

At block 128, the example method 100 includes removing the sacrificial epitaxial layers to form nanosheets. Referring to the example of FIG. 21, in an embodiment of block 128, sacrificial epitaxial layers have been removed thereby releasing channel members from the channel region of the GAA device. In the illustrated embodiment, channel members are channel epitaxial layers 216 in the form of nanosheets. In various embodiments, the channel epitaxial layers 216 include silicon, and the sacrificial epitaxial layers 214 include silicon germanium. In various embodiments, the plurality of sacrificial epitaxial layers 214 were selectively removed via a selective removal process that included oxidizing the plurality of sacrificial epitaxial layers 214 using a suitable oxidizer, such as ozone. Thereafter, the oxidized sacrificial epitaxial layers 214 were selectively removed via a dry etching process, for example, by applying an HCl gas at a temperature of about 500 degrees Celsius to about 700 degrees Celsius, or applying a gas mixture of $CF_4$, $SF_6$, and $CHF_3$.

At block 130, the example method 100 includes forming high-K metal gate structures. Referring to the example of FIG. 22, in an embodiment of block 130, a gate structure 260 is formed. In various embodiments, the gate structure is the gate of a multi-gate transistor. In various embodiments, the gate structure is a high-K metal gate stack, however other compositions are possible. In various embodiments the high-K metal gate stack includes a gate dielectric layer that includes an interfacial layer 262 and a high-k dielectric layer 264. The high-k dielectric layer 264 wraps each of the nanosheets 216, and the interfacial layer 262 is interposed between the high-k dielectric layer and the nanosheets 216. The interfacial layer 262 may include a dielectric material such as silicon oxide ($SiO_2$) or silicon oxynitride (SiON), and may be formed by chemical oxidation, thermal oxidation, atomic layer deposition (ALD), CVD, and/or other suitable methods. The high-k dielectric layer may include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In one embodiment, the gate dielectric layer is formed using a highly conformal deposition process such as ALD in order to ensure the formation of a gate dielectric layer having a uniform thickness around each channel layers. The high-K metal gate structures may include additional material layers.

At block 132, the example method 100 includes performing further fabrication. A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Improved systems, fabrication methods, fabrication techniques, and articles have been described. The described systems, methods, techniques, and articles can be used with a wide range of semiconductor devices including Gate-all-around FET (GAAFET/NSFET)/Fork-sheet/CFET/VFET/MOSFET. The described systems, methods, techniques, and articles can be used in the manufacture of semiconductor devices including semiconductor devices with a nanosheet structure. The described systems, methods, techniques, and articles can be used to precisely control a MG CD profile, thereby improving the performance of devices properties and integrated circuits.

In some aspects, the techniques described herein relate to a fabrication method, including: forming, on a substrate, an epitaxial stack including at least one sacrificial epitaxial layer and at least one channel epitaxial layer; forming a fin in the epitaxial stack; forming a sacrificial gate stack on channel regions of the fin; forming gate sidewall spacers on sidewalls of the sacrificial gate stack; performing pre-treatment operations to remove impurities from the at least one sacrificial epitaxial layer; recessing the at least one sacrificial epitaxial layer to form a cavity; forming inner spacer material in the cavity; forming source/drain features; removing the sacrificial gate stack and the at least one sacrificial epitaxial layer in the fin; and forming a metal gate to replace the sacrificial gate stack and the at least one sacrificial epitaxial layer, wherein the inner spacer material has sufficient thickness to resist epi damage.

In some aspects, the techniques described herein relate to a fabrication method, wherein the at least one sacrificial epitaxial layer has a line width roughness (LWR) that is less than 3 nanometers (nm) after recessing the at least one sacrificial epitaxial layer.

In some aspects, the techniques described herein relate to a fabrication method, wherein the at least one sacrificial epitaxial layer has a critical dimension (CD) in a range of 5 to 20 nm, and the cavity has a recessed dimension of less than 6 nm.

In some aspects, the techniques described herein relate to a fabrication method, wherein performing pre-treatment operations includes applying Hydrogen (H*) radicals and Nitrogen (N*) radicals to the at least one sacrificial epitaxial layer and the at least one channel epitaxial layer.

In some aspects, the techniques described herein relate to a fabrication method, wherein performing pre-treatment operations further includes applying a hydrogen fluoride (HF) flush to remove byproducts from applying the H* and N* radicals.

In some aspects, the techniques described herein relate to a fabrication method, wherein performing pre-treatment operations includes nitridation operations, carbon removal operations, and oxide removal operations.

In some aspects, the techniques described herein relate to a fabrication method, wherein the at least one sacrificial epitaxial layer includes silicon germanium (SiGe) and the at least one channel epitaxial layer includes silicon (Si).

In some aspects, the techniques described herein relate to a fabrication method, wherein the impurities include one or more of $SiO_x$ wherein x is value from 1 to 3, carbon (C), and $GeO_x$ wherein x is value from 1 to 3.

In some aspects, the techniques described herein relate to a fabrication method, including: forming, on a substrate, an epitaxial stack including at least one sacrificial epitaxial layer and at least one channel epitaxial layer; forming a fin in the epitaxial stack; forming a sacrificial gate stack on channel regions of the fin; forming gate sidewall spacers on sidewalls of the sacrificial gate stack; performing pre-treatment operations to remove impurities from the at least one sacrificial epitaxial layer, wherein performing pre-treatment operations include: applying Hydrogen (H*) radicals and Nitrogen (N*) radicals to the at least one sacrificial epitaxial layers and channel epitaxial layers; and applying a hydrogen fluoride (HF) flush to remove byproducts from applying the H* and N* radicals; recessing the at least one sacrificial epitaxial layer to form a cavity; and forming inner spacer material in the cavity, wherein the inner spacer material has sufficient thickness to resist epi damage.

In some aspects, the techniques described herein relate to a fabrication method, wherein the at least one sacrificial epitaxial layer has a line width roughness (LWR) that is less than 3 nanometers (nm) after recessing the at least one sacrificial epitaxial layer.

In some aspects, the techniques described herein relate to a fabrication method, wherein the at least one sacrificial epitaxial layer has a critical dimension (CD) in a range of 5 to 20 nm, and the cavity has a recessed dimension of less than 6 nm.

In some aspects, the techniques described herein relate to a fabrication method, wherein the at least one sacrificial epitaxial layer includes silicon germanium (SiGe) and the at least one channel epitaxial layer includes silicon (Si).

In some aspects, the techniques described herein relate to a fabrication method, wherein the impurities include one or more of $SiO_x$ wherein x is value from 1 to 3, carbon (C), and $GeO_x$ wherein x is value from 1 to 3.

In some aspects, the techniques described herein relate to a fabrication method, including: forming, on a substrate, an epitaxial stack including at least one sacrificial epitaxial layer and at least one channel epitaxial layer; forming a fin in the epitaxial stack; forming a sacrificial gate stack on channel regions of the fin; forming gate sidewall spacers on sidewalls of the sacrificial gate stack; performing pre-treatment operations to remove impurities from the at least one sacrificial epitaxial layer, wherein performing pre-treatment operations include nitridation operations, carbon removal operations, and oxide removal operations; recessing the at least one sacrificial epitaxial layer to form a cavity; and forming inner spacer material in the cavity, wherein the inner spacer material has sufficient thickness to resist epi damage.

In some aspects, the techniques described herein relate to a fabrication method, wherein the at least one sacrificial epitaxial layer has a line width roughness (LWR) that is less than 3 nanometers (nm) after recessing the at least one sacrificial epitaxial layer.

In some aspects, the techniques described herein relate to a fabrication method, wherein the at least one sacrificial epitaxial layer has a critical dimension (CD) in a range of 5 to 20 nm, and the cavity has a recessed dimension of less than 6 nm.

In some aspects, the techniques described herein relate to a fabrication method, wherein the impurities include one or more of $SiO_x$ wherein x is value from 1 to 3, carbon (C), and $GeO_x$ wherein x is value from 1 to 3.

In some aspects, the techniques described herein relate to a fabrication method, wherein the nitridation operations include applying $N_2$ radicals to the at least one sacrificial epitaxial layer and the at least one channel epitaxial layer.

In some aspects, the techniques described herein relate to a fabrication method, wherein the carbon removal operations include applying $N_2$ and $H_2$ radicals to the at least one sacrificial epitaxial layer and the at least one channel epitaxial layer to remove carbon.

In some aspects, the techniques described herein relate to a fabrication method, wherein the oxide removal operations include applying a hydrogen fluoride (HF) flush to the at least one sacrificial epitaxial layer and the at least one channel epitaxial layer to remove oxide.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method, comprising:

forming, on a substrate, an epitaxial stack comprising at least one sacrificial epitaxial layer and at least one channel epitaxial layer;

forming a fin in the epitaxial stack;

forming a sacrificial gate stack on channel regions of the fin;

forming gate sidewall spacers on sidewalls of the sacrificial gate stack;

performing pre-treatment operations to remove impurities from the at least one sacrificial epitaxial layer, wherein performing pre-treatment operations comprise nitridation operations, carbon removal operations, and oxide removal operations;

recessing the at least one sacrificial epitaxial layer to form a cavity; and forming inner spacer material in the cavity, wherein the inner spacer material has sufficient thickness to resist epi damage.

2. The method of claim 1, wherein the at least one sacrificial epitaxial layer has a line width roughness (LWR) that is less than 3 nanometers (nm) after recessing the at least one sacrificial epitaxial layer.

3. The method of claim 2, wherein the at least one sacrificial epitaxial layer has a critical dimension (CD) in a range of 5 to 20 nm, and the cavity has a recessed dimension of less than 6 nm.

4. The method of claim 1, wherein the impurities comprise one or more of $SiO_X$ wherein x is a value from 1 to 3, carbon (C), and $GeO_y$ wherein y is value from 1 to 3.

5. The method of claim 1, wherein the nitridation operations comprise applying $N_2$ radicals to the at least one sacrificial epitaxial layer and the at least one channel epitaxial layer.

6. The method of claim 5, wherein the carbon removal operations include applying $N_2$ and $H_2$ radicals to the at least one sacrificial epitaxial layer and the at least one channel epitaxial layer to remove carbon.

7. The method of claim 6, wherein the oxide removal operations include applying a hydrogen fluoride (HF) flush to the at least one sacrificial epitaxial layer and the at least one channel epitaxial layer to remove oxide.

8. The method of claim 1, further comprising:

forming source/drain features;

removing the sacrificial gate stack and the at least one sacrificial epitaxial layer in the fin; and forming a metal gate to replace the sacrificial gate stack and the at least one sacrificial epitaxial layer.

9. The method of claim 1, wherein the at least one sacrificial epitaxial layer comprises silicon germanium (SiGe) and the at least one channel epitaxial layer comprises silicon (Si).

10. A method, comprising:

providing a fin on an epitaxial stack formed over on a substrate and comprising at least one sacrificial epitaxial layer and at least one channel epitaxial layer;

forming a sacrificial gate stack on channel regions of the fin;

forming gate sidewall spacers on sidewalls of the sacrificial gate stack;

performing pre-treatment operations to remove impurities from the at least one sacrificial epitaxial layer, wherein performing pre-treatment operations comprise nitridation operations, carbon removal operations, and oxide removal operations;

recessing the at least one sacrificial epitaxial layer to form a cavity; and forming inner spacer material in the cavity.

11. The method of claim 1, wherein the at least one sacrificial epitaxial layer has a line width roughness (LWR) that is less than 3 nanometers (nm) after recessing the at least one sacrificial epitaxial layer.

12. The method of claim 2, wherein the at least one sacrificial epitaxial layer has a critical dimension (CD) in a range of 5 to 20 nm, and the cavity has a recessed dimension of less than 6 nm.

13. The method of claim 1, wherein the impurities comprise one or more of $SiO_x$ wherein x is a value from 1 to 3, carbon (C), and $GeO_y$ wherein y is a value from 1 to 3.

14. The method of claim 1, wherein the nitridation operations comprise applying $N_2$ radicals to the at least one sacrificial epitaxial layer and the at least one channel epitaxial layer.

15. The method of claim 1, wherein the carbon removal operations include applying $N_2$ and $H_2$ radicals to the at least one sacrificial epitaxial layer and the at least one channel epitaxial layer to remove carbon.

16. The method of claim 1, wherein the oxide removal operations include applying a hydrogen fluoride (HF) flush to the at least one sacrificial epitaxial layer and the at least one channel epitaxial layer to remove oxide.

17. A method, comprising:

forming, on a substrate, an epitaxial stack comprising a plurality of sacrificial epitaxial layers and a plurality of channel epitaxial layers;

forming a fin in the epitaxial stack;

forming a sacrificial gate stack on channel regions of the fin;

forming gate sidewall spacers on sidewalls of the sacrificial gate stack;

performing pre-treatment operations to remove impurities from the plurality of sacrificial epitaxial layers, wherein performing pre-treatment operations comprise nitridation operations, carbon removal operations, and oxide removal operations;

recessing the plurality of sacrificial epitaxial layers to form a plurality of cavities; and forming inner spacer material in the plurality of cavities.

18. The method of claim 17, further comprising:

forming source/drain features;

removing the sacrificial gate stack and the plurality of sacrificial epitaxial layers in the fin; and forming a metal gate to replace the sacrificial gate stack and the plurality of sacrificial epitaxial layers.

19. The method of claim 18, wherein:

the nitridation operations comprise applying $N_2$ radicals to the plurality of sacrificial epitaxial layers and the plurality of channel epitaxial layers;

the carbon removal operations include applying $N_2$ and $H_2$ radicals to the plurality of sacrificial epitaxial layers and the plurality of channel epitaxial layers to remove carbon; and the oxide removal operations include applying a hydrogen fluoride (HF) flush to the plurality of sacrificial epitaxial layers and the plurality of channel epitaxial layers to remove oxide.

20. The method of claim 19, wherein at least one sacrificial epitaxial layer of the plurality of sacrificial epitaxial layers has a line width roughness (LWR) that is less than 3 nanometers (nm) after recessing the plurality of sacrificial epitaxial layers.

* * * * *